(12) United States Patent
Srinivasan et al.

(10) Patent No.: US 7,803,879 B2
(45) Date of Patent: Sep. 28, 2010

(54) FORMALDEHYDE FREE BINDER

(75) Inventors: Ramji Srinivasan, Alpharetta, GA (US);
Kurt Gabrielson, Lilburn, GA (US);
John B. Hines, Atlanta, GA (US);
Cornel Hagiopol, Lilburn, GA (US)

(73) Assignee: Georgia-Pacific Chemicals LLC, Atlanta, GA (US)

( * ) Notice: Subject to any disclaimer, the term of this patent is extended or adjusted under 35 U.S.C. 154(b) by 941 days.

(21) Appl. No.: 11/454,326

(22) Filed: Jun. 16, 2006

(65) Prior Publication Data

US 2007/0292618 A1 Dec. 20, 2007

(51) Int. Cl.
*C08F 8/32* (2006.01)
*C08F 20/08* (2006.01)

(52) U.S. Cl. .............. 525/327.6; 525/327.4; 525/333.3; 525/333.6; 525/380; 525/384

(58) Field of Classification Search .............. 525/327.4, 525/327.6, 333.3, 333.6, 380, 384
See application file for complete search history.

(56) References Cited

U.S. PATENT DOCUMENTS

| | | | |
|---|---|---|---|
| 2,486,804 A | 11/1949 | Seymour et al | |
| 3,245,933 A | 4/1966 | Muskat | |
| 3,297,657 A | 1/1967 | Gray et al. | |
| 3,715,233 A | 2/1973 | Harrier | |
| 3,880,811 A | 4/1975 | Kaupp | |
| 4,029,623 A | 6/1977 | Maaghul | |
| 4,032,690 A * | 6/1977 | Kohmura et al. | ............ 503/209 |
| 4,054,713 A | 10/1977 | Sakaguchi et al. | |
| 4,220,752 A | 9/1980 | Fink et al. | |
| 4,330,444 A | 5/1982 | Pollman | |
| 4,477,496 A | 10/1984 | Das et al. | |
| 5,030,507 A | 7/1991 | Mudge et al. | |
| 5,047,452 A | 9/1991 | Gicquel | |
| 5,091,465 A | 2/1992 | Dana et al. | |
| 5,134,188 A | 7/1992 | Blum et al. | |
| 5,198,492 A | 3/1993 | Stack | |
| 5,278,222 A | 1/1994 | Stack | |
| 5,318,990 A | 6/1994 | Strauss | |
| 5,340,868 A | 8/1994 | Strauss et al. | |
| 5,354,803 A | 10/1994 | Dragner et al. | |
| 5,362,842 A | 11/1994 | Graves et al. | |
| 5,389,716 A | 2/1995 | Graves | |
| 5,393,849 A | 2/1995 | Srinivasan et al. | |
| 5,498,658 A | 3/1996 | Pourahmady et al. | |
| 5,520,997 A | 5/1996 | Pourahmady et al. | |
| 5,661,213 A | 8/1997 | Arkens et al. | |
| 5,670,585 A | 9/1997 | Taylor et al. | |
| 5,763,524 A | 6/1998 | Arkens et al. | |
| 5,919,873 A | 7/1999 | Irving | |
| 5,932,665 A | 8/1999 | Deporter et al. | |
| 5,932,689 A | 8/1999 | Arkens et al. | |
| 5,977,232 A | 11/1999 | Arkens et al. | |
| 6,039,821 A | 3/2000 | Buck | |
| 6,071,994 A | 6/2000 | Hummerich et al. | |
| 6,099,773 A | 8/2000 | Reck et al. | |
| 6,114,464 A | 9/2000 | Reck et al. | |
| 6,136,916 A | 10/2000 | Arkens et al. | |
| 6,171,654 B1 | 1/2001 | Salsman et al. | |
| 6,194,512 B1 | 2/2001 | Chen et al. | |
| 6,221,973 B1 | 4/2001 | Arkens et al. | |
| 6,299,936 B1 | 10/2001 | Reck et al. | |
| 6,331,350 B1 | 12/2001 | Taylor et al. | |
| 6,407,197 B1 | 6/2002 | Van Den Berg et al. | |
| 6,426,121 B1 | 7/2002 | Goldstein et al. | |
| 6,699,945 B1 | 3/2004 | Chen et al. | |
| 6,734,232 B2 | 5/2004 | Hagiopol | |
| 6,734,237 B1 | 5/2004 | Taylor et al. | |
| 6,803,439 B2 | 10/2004 | Taylor | |
| 7,067,579 B2 | 6/2006 | Taylor et al. | |
| 2001/0029280 A1 | 10/2001 | Ulrich et al. | |
| 2004/0033747 A1 | 2/2004 | Miller et al. | |
| 2004/0034154 A1 | 2/2004 | Tutin et al. | |
| 2004/0038017 A1 | 2/2004 | Tutin et al. | |
| 2004/0082240 A1 | 4/2004 | Rodrigues | |
| 2004/0082241 A1 | 4/2004 | Rodrigues | |
| 2004/0254285 A1 | 12/2004 | Rodrigues et al. | |
| 2005/0059770 A1 | 3/2005 | Srinivasan et al. | |

(Continued)

FOREIGN PATENT DOCUMENTS

CA 2507776 7/2004

(Continued)

OTHER PUBLICATIONS

International Search Report for PCT/US2007/068226 mailed Nov. 21, 2007.

(Continued)

*Primary Examiner*—Helen L. Pezzuto
(74) *Attorney, Agent, or Firm*—Michael S. Kerns

(57) ABSTRACT

An aqueous, formaldehyde-free binder composition comprising a modified copolymer of maleic anhydride and a vinyl aromatic compound such as styrene, the copolymer being modified by reaction with a primary alkanolamine, such as monoethanolamine (MEA), to produce a modified copolymer that is self-curing and cures as a consequence of cross-linking, esterification reactions between pendant carboxyls and hydroxyl groups on the solubilized (hydrolyzed) modified copolymer chains; the invention also relates to the corresponding method of using the binder composition for making fiber products, especially fiberglass insulation.

26 Claims, 2 Drawing Sheets

U.S. PATENT DOCUMENTS

| | | | |
|---|---|---|---|
| 2005/0112374 A1 | 5/2005 | Jaffee et al. | |
| 2006/0231487 A1* | 10/2006 | Bartley et al. | 210/506 |
| 2007/0292619 A1 | 12/2007 | Srinivasan et al. | |
| 2010/0029160 A1 | 2/2010 | Srinivasan et al. | |

FOREIGN PATENT DOCUMENTS

| | | |
|---|---|---|
| DE | 1745954 | 9/1971 |
| DE | 247456 | 7/1987 |
| DE | 247456 A1 | 7/1987 |
| DE | 4342157 | 6/1995 |
| DE | 4342157 A1 | 6/1995 |
| EP | 0004053 | 9/1979 |
| EP | 0353493 | 2/1990 |
| EP | 0583086 | 2/1994 |
| EP | 0990729 | 4/2000 |
| EP | 1170265 A1 | 1/2002 |
| EP | 1770123 A1 | 4/2007 |
| FR | 2587024 A1 | 3/1987 |
| JP | 6-287276 A1 | 10/1994 |
| SU | 1073240 A * | 2/1984 |
| WO | WO-95/30061 | 11/1995 |
| WO | 9936368 A1 | 7/1999 |
| WO | 0105725 A1 | 1/2001 |
| WO | 0196460 A1 | 1/2001 |
| WO | WO 2005/035601 | 4/2005 |

OTHER PUBLICATIONS

International Search Report for PCT/US2007/068317 mailed Nov. 8, 2007.

Abstract of Adylova, K.M; Akhmedov, U.K., Akhmedov, K.S., Synthesis of Water-Soluble Diphilic Polymers from Styrene-Maleic Anhydride Copolymer and Amino Alcohols, Doklady Akademii Nauk UzSSR, 1984, pp. 28-29, (12), Tashk. Politekh. Inst., Tashkent, USSR.

International Search Report for PCT/US03/17279 mailed Aug. 22, 2003, two pages, Alexandria, VA, USA.

International Search Report for PCT/US03/15399 mailed Dec. 29, 2003, three pages, Alexandria, VA, USA.

European Patent Office, Supplementary European Search Report for Application No. 03736789.3 dated Feb. 6, 2006, five pages, Rijswijk, Netherlands.

Written Opinion of the International Searching Authority for PCT/US2007/068317 mailed Nov. 08, 2007, five pages, Rijswijk, Netherlands.

Written Opinion of the International Searching Authority for PCT/US2007/068226 mailed Nov. 21, 2007, six pages, Rijswijk, Netherlands.

Office Action U.S. Appl. No. 11/454,327, mailed Jul. 9, 2009, nine pages, Alexandria, VA, USA.

Office Action response for U.S. Application No. 11/454,327, Nov. 6, 2009, 13 pages.

Interview Summary for U.S. Appl. No. 11/454,327, Nov. 10, 2009, three pages, Alexandria, VA, USA.

* cited by examiner

Crosslinked Polymer
(with amide, ester and
imide links depending
on the polyol)

FORMALDEHYDE FREE BINDER

FIELD OF THE INVENTION

The present invention relates to a new formaldehyde-free binder composition, to the related method of its use for making fibrous products (including glass fiber products and especially fiberglass insulation), and to the fiber products themselves. The present invention specifically relates to an aqueous binder composition containing a modified copolymer of maleic anhydride and a vinyl aromatic compound such as styrene. The copolymer is modified by reaction with a primary alkanolamine (preferably monoethanolamine (MEA)). The modified copolymer is self-curing and cures as a consequence of cross-linking, esterification reactions between pendant carboxyls and hydroxyl groups on the solubilized (hydrolyzed) modified copolymer chains. Additional polyol(s), including diethanolamine and/or triethanolamine, can be added to the binder to increase either, or both the pH of the aqueous binder composition and the crosslink density of the cured binder.

BACKGROUND OF THE INVENTION

Phenol-formaldehyde (PF) resins, as well as PF resins extended with urea (PFU resins), have been the mainstays of fiberglass insulation binder technology over the past several years. Such resins are inexpensive and provide the cured fiberglass insulation product with excellent physical properties.

One of the drawbacks of this technology, however, is the potential for formaldehyde emissions during the preparation of the adhesive resin, during the manufacturing of the fiberglass insulation and during its subsequent use.

Fiberglass insulation is typically made by spraying a dilute aqueous solution of the PF or PFU resin adhesive binder onto glass fibers, generally hot from being recently formed, forming a mat or blanket of the binder-treated fibers and then heating the mat or blanket to an elevated temperature in an oven to cure fully the adhesive resin.

Manufacturing facilities using PF and PFU resins as the main adhesive binder component for insulation products recently have had to invest in pollution abatement equipment to minimize the possible exposure of workers to formaldehyde emissions and to meet Maximum Achievable Control Technology (MACT) requirement Standards.

As an alternative to PF and PFU resins, certain formaldehyde free formulations have been developed for use as an adhesive binder for making fiberglass insulation products. One of the challenges to developing suitable alternatives, however, is to identify formulations that have physical properties (viscosity, dilutability, etc.) and other characteristics similar to the standard PF and PFU resins, i.e., formulations which also have a similar cure time/cure temperature profile, while yielding a cured fiberglass insulation product with equivalent physical properties.

U.S. Pat. No. 5,030,507 describes an emulsion copolymer binder for nonwoven products that is alleged to cure formaldehyde free. The copolymer is prepared by the emulsion polymerization of an (meth)acrylic acid ester, in combination with styrene, acrylonitrile or vinyl acetate, and both a hydroxy(meth)acrylate and an isocyanate.

U.S. Pat. Nos. 5,198,492 and 5,278,222 describe a latex binder for cellulose, said to be especially useful where low formaldehyde emissions are important. The binder is a combination of a non-formaldehyde emitting latex admixed with an aqueous copolymer dispersion of a highly functionalized emulsion copolymer. The functionalized emulsion copolymer is a low solids emulsion, i.e., 10 to 16% by weight of solids, made from 10 to 60% of an olefinically unsaturated non-ionic organic compound and equal parts of a carboxylic acid and an olefinically unsaturated carboxylic acid hydroxy ester, or an olefinically unsaturated amide, or a mixture thereof.

U.S. Pat. No. 5,318,990 describes a formaldehyde free formulation for fiberglass insulation based on an aqueous solution of a polymeric carboxylic acid, especially a polyacrylic acid, and a monomeric triol, such as glycerol, trimethylolpropane and the like. Other polyols may optionally be present. The formulation requires the presence of a phosphorus accelerator (catalyst) in the aqueous solution to obtain an effective cure at suitable temperatures.

U.S. Pat. No. 5,340,868 describes a binder for making a fiberglass mat comprising an aqueous solution of a polymeric carboxylic acid, such as polyacrylic acid, a β-hydroxyalkylamide and an at least tri-functional monomeric carboxylic acid, such as citric acid, trimellitic acid, hemimellitic acid, trimesic acid, tricarballylic acid, 1,2,3,4-butanetetracarboxylic acid (BTCA) and pyromellitic acid.

U.S. Pat. No. 5,354,803 describes a graft copolymer of a low molecular polyvinyl alcohol (PVOH) as a formaldehyde-free binder, having a vinyl or acrylic monomer grafted onto the PVOH through emulsion polymerization in the presence of free-radical generators. Suitable monomers include acrylic acid and maleic acid.

U.S. Pat. No. 5,393,849 describes a curable composition useful in making binder formulations made by combining an unsaturated polyester resin and a polyamino compound.

U.S. Pat. No. 5,498,658 (and the related divisional U.S. Pat. No. 5,520,997) describes a self-curing, formaldehyde-free interpolymer latex binder. The interpolymer is prepared principally by emulsion polymerization from the following monomers (1) an unsaturated monomer having a nucleophile group, (2) an unsaturated dicarboxylic acid, (3) (meth)acrylonitrile and optionally (4) a (meth)acrylic acid ester and (5) styrene. As described, the unsaturated monomer having a nucleophile group has a functional group, such as an amino or hydroxyl, which in combination with the dicarboxylic acid, allows the polymer to self-cross-link. Examples of such monomers are acrylamide and hydroxypropyl acrylate (see Examples 1, 2 and 3). Representative dicarboxylic acids include maleic acid and itaconic acid.

U.S. Pat. No. 5,661,213 (and the related patents U.S. Pat. Nos. 5,763,524; 6,136,916 and 6,221,973) describes a formaldehyde free formulation for fiberglass insulation based on an aqueous solution of a polyacid, such as a polyacrylic acid, and a polyol (at least a diol), with a molecular weight less than about 1000, such as, for example, ethylene glycol, glycerol, pentaerythritol, trimethylol propane, sorbitol, sucrose, glucose, resorcinol, catechol, pyrogallol, glycollated ureas, 1,4-cyclohexane diol, diethanolamine, triethanolamine, and certain reactive polyols such as, for example, β-hydroxyalkylamides. The carboxyl groups of the polyacid are neutralized to an extent of less than about 35% with a fixed base. The formulation generally requires the presence of a phosphorus accelerator (catalyst) in the aqueous solution to obtain an effective cure at suitable temperatures.

U.S. Pat. No. 5,932,689 describes a formaldehyde free formulation for fiberglass insulation based on a combination of three components (1) a polyacid, such as polyacrylic acid, (2) an active hydrogen-containing compound, such as a polyol, or a polyamine, and (3) a cyanamide, a dicyanamide or a cyanoguanidine. In this formulation, an accelerator (catalyst) is said to be optional. Suitable accelerators include a phosphorus or fluoroborate compound. As above, the carboxyl groups of the polyacid are neutralized to an extent of less than about 35% with a fixed base.

U.S. Pat. No. 5,977,232 describes a formaldehyde free formulation for fiberglass insulation based on a combination of three essential components (1) a polyacid, such as polyacrylic acid, (2) an active hydrogen-containing compound, such as a polyol, or a polyamine, and (3) a fluoroborate accelerator.

U.S. Pat. No. 6,071,994 describes a formaldehyde-free aqueous binder comprising (1) a free-radically polymerized polymer containing from 5 to 100% by weight of units derived either from an ethylenically unsaturated acid anhydride, or from an ethylenically unsaturated dicarboxylic acid whose carboxyl groups can form an anhydride group, and (2) an alkanolamine having at least two hydroxyl groups. Based on the specific examples in this patent, polymers containing acrylic acid are preferred and all of the examples were formulated to cure at a pH of below 4.0.

U.S. Pat. No. 6,114,464 describes a binder for producing shaped articles, such as chipboard, comprising a curable composition of an addition polymer of an unsaturated mono- or dicarboxylic acid and a multi-hydroxyalkylated polyamine.

U.S. Pat. No. 6,171,654 describes preparing fiberglass insulation using a water soluble or water-dispersible curable polyester resin binder formed by reacting a polyol, such as pentaerythritol, a terephthalate polymer, such as recycled polyethylene terephthalate (PET), a polyacid, such as isophthalic and terephthalic acid, an end (mono-functional) acid, a reactive diluent (crosslinker) such as a melamine resin, and an acid catalyst.

U.S. Pat. No. 6,331,350 describes a binder formulation for fiberglass very similar to U.S. Pat. No. 5,661,213 except that the polyacid must have a low molecular weight and the pH of the aqueous solution must be adjusted to less than 3.5.

U.S. Pat. No. 6,426,121 describes dual cross-linkable emulsion polymers for use with nonwoven materials. The polymers "incorporate at least two different but reactive functionalities, i.e., hydroxy and carboxy." The polymer is formed by polymerizing ethylenically unsaturated carboxylic acids in the presence of PVOH. Hydroxyl functionality can be incorporated using hydroxy functional acrylates. The patent does not describe the polymer as self-cross-linking and suggests cross-linking by using a dual crosslinker system of a polyaldehyde and a polyaziridine.

U.S. Publications 2004/0033747; 2004/0082240 and 2004/0082241 describe aqueous binder compositions employing a copolymer having both hydroxyl and carboxyl functions that can be used to prepare non-woven mats, such as fiberglass insulation.

Despite these disclosures, there is a continuing need for identifying new formaldehyde-free, curable aqueous compositions suitable for use as a binder, specifically for fiberglass and especially for making glass fiber products such as fiberglass insulation.

Indeed, because most, if not all, of the prior art binder formulations employing polyacid-type polymer ingredients, such as a polyacrylic acid, are formulated at an acidic pH, a pH of below about 4.0 being typical, there is a heightened risk of incurring accelerated corrosion of process equipment associated with the storage, transport, and application of the binder compositions.

DETAILED DESCRIPTION OF THE INVENTION

Figure 1:
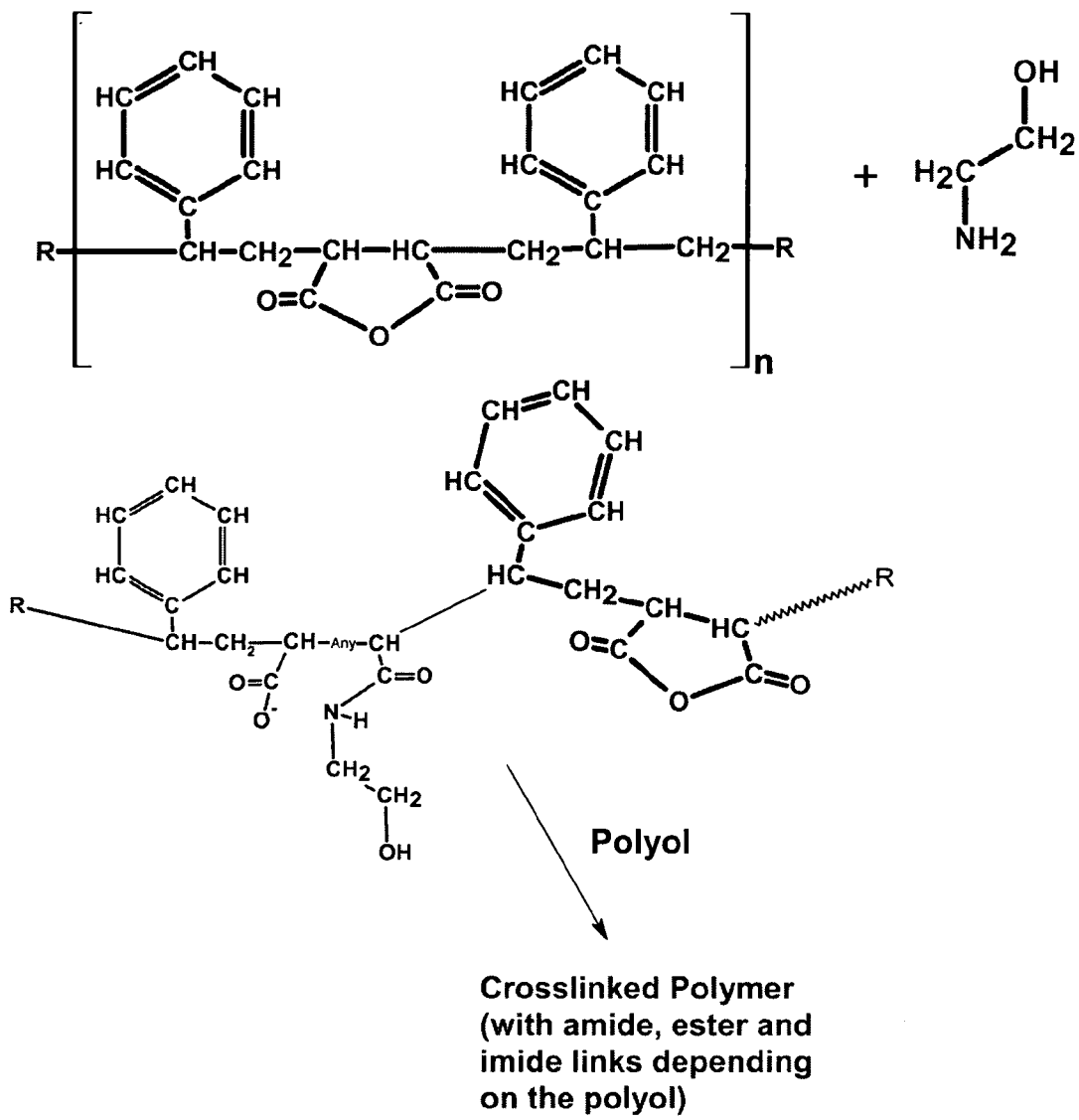
FIG. 1 illustrates the nature of the chemical reaction that is believed to occur as a consequence of MEA modification of an SMA copolymer in accordance with the present invention.

The present invention is directed to a formaldehyde-free binder composition, the related method of its use for making non-woven fiber products (e.g., fiberglass insulation and related products, such as thin fiberglass mats (all hereinafter referred to generically as glass fiber products)) and the resulting products themselves, especially fiberglass insulation products, made with the cured (crosslinked) binder composition.

The present invention is specifically directed to an aqueous binder composition containing a modified copolymer of maleic anhydride and a vinyl aromatic compound such as styrene. The copolymer is modified by reaction with a primary alkanolamine (preferably monoethanolamine (MEA)). The modified copolymer is self-curing and cures as a consequence of cross-linking, esterification reactions between pendant carboxyls and hydroxyl groups on the solubilized (hydrolyzed) modified copolymer chains. Additional polyol(s) can be added to the binder composition to increase both the pH of the aqueous binder composition and the crosslink density of the cured binder.

In one preferred embodiment, the present invention relates to an aqueous binder composition containing a modified styrene-maleic anhydride (SMA) copolymer.

Using well-known and widely available technology, maleic anhydride (and alternatively maleic acid) and a vinyl aromatic compound, preferably styrene, can be copolymerized, generally in a bulk process, using free radical initiators to yield a copolymer (in the case of a styrene-maleic anhydride (maleic acid) copolymer the material is commonly identified as SMA). Suitable SMA copolymers for practicing the present invention are commercially available from many sources, such that the details of SMA copolymerization procedures need not be described herein.

The fully formulated binder composition can be applied as a dilute aqueous solution to the fibers and can be cured by thermal energy, i.e., by heat. In the preferred embodiments, the aqueous solution has a substantially alkaline pH (pH of at least 5.0) and usually a pH of 7 or above. Curing (e.g., crosslinking) of the polymer in the binder composition takes place via an esterification reaction between pendant carboxyl groups of the modified copolymers (preferably modified SMA copolymer) and both pendant hydroxyl groups of the modified copolymers (preferably modified SMA copolymer) and hydroxyl groups from optionally added polyol(s), such as from diethanolamine and/or triethanolamine. Additional crosslinking may occur with any additional polyol that may optionally be added to the formulation.

As used herein, "curing," "cured" and similar terms are intended to embrace the structural and/or morphological change which occurs in an aqueous binder composition of the present invention, such as by covalent chemical reaction (crosslinking), ionic interaction or clustering, improved adhesion to the substrate, phase transformation or inversion, and hydrogen bonding when the binder composition is dried and heated to cause the properties of a flexible, porous substrate, such as a mat or blanket of glass fibers, especially glass fibers, to which an effective amount of the binder composition has been applied, to be altered.

The term "cured binder" means the cured product of the modified copolymer of maleic anhydride and a vinyl aromatic compound and any added polyol, which cured product bonds the fibers of a fibrous product together. Generally, the bonding occurs at the intersection of overlapping fibers.

By "formaldehyde-free" is meant that the composition is substantially free from formaldehyde, and does not liberate substantial formaldehyde as a result of drying and/or curing; typically, less than 1 ppm formaldehyde, based on the weight of the composition, is present in a formaldehyde-free composition. In order to minimize the formaldehyde content of the composition it is preferred to use additives that are themselves free from formaldehyde and do not generate formaldehyde during drying and/or curing.

As used herein, "aqueous" means water and mixtures composed substantially of water.

As used herein the terms "fiber," "fibrous" and the like are intended to embrace materials that have an elongated morphology exhibiting an aspect ratio (length to thickness) of greater than 100, generally greater than 500, and often greater than 1000. Indeed, an aspect ratio of over 10,000 is possible.

As used herein the phrase "heat resistant fibers" and the like are intended to embrace heat-resistant fibers suitable for withstanding elevated temperatures such as mineral fibers, aramid fibers, ceramic fibers, metal fibers, carbon fibers, polyimide fibers, certain polyester fibers, rayon fibers, and especially glass fibers. Such fibers are substantially unaffected by exposure to temperatures above about 120° C.

As used herein the phrase "substantially alkaline" means a pH of above about 5.0. The phrase "an alkaline pH" means a pH of above 7.0.

As used throughout the specification and claims, the terms "mat," "batt" and "blanket" are used somewhat interchangeably to embrace a variety of glass fiber substrates of a range of thicknesses and densities, made by entangling short fibers, long continuous fibers and mixtures thereof. Particularly preferred are mats, batts, or blankets made using heat resistant fibers.

The term "water dilutable" when used in connection with a binder composition means that water can be added to the binder composition in an amount of at least ten times the mass of the composition without causing solids to precipitate.

In a first aspect, the present invention is directed to an aqueous binder composition, preferably a substantially alkaline aqueous binder composition and most preferably an alkaline binder composition, comprising, as its essential constituent, a modified copolymer of maleic anhydride and a vinyl aromatic compound (preferably a modified SMA copolymer). The binder composition may optionally contain additional polyol, preferably diethanolamine (DEA), triethanolamine (TEA), or a mixture thereof.

In another aspect, the present invention provides a method for binding together a loosely associated, non-woven mat or blanket of fibers, preferably heat resistant fibers, comprising (1) contacting said fibers with a curable, aqueous (preferably substantially alkaline and most preferably alkaline) binder composition containing a modified copolymer of maleic anhydride and a vinyl aromatic compound (preferably a modified SMA copolymer), and (2) heating said curable binder composition to an elevated temperature, which temperature is sufficient to effect cure of the copolymer. Preferably, curing is effected at a temperature broadly within the range from 75° C. to 300° C. usually at a temperature between 100° C. and up to a temperature of about 250° C.

In yet another aspect, the present invention provides a fibrous product, preferably a glass fiber product and especially a fiberglass insulation product, comprising a crosslinked (cured) binder composition obtained by curing a curable binder composition as defined above, applied to the fibers, preferably heat resistant fibers and particularly glass fibers, which are assembled into a non-woven mat or blanket.

The copolymer used to prepare the composition of the present invention is prepared from maleic anhydride (or maleic acid), i.e., MA monomer and a vinyl aromatic monomer. Suitable vinyl aromatic monomers are, for instance, styrene, alpha-methylstyrene and vinyl toluene. The copolymer (e.g., an SMA copolymer) preferably contains styrene monomer as the vinyl aromatic monomer.

A copolymer containing vinyl aromatic monomer and MA monomer can be prepared using known processes and requires no description here. The copolymer (e.g., an SMA copolymer) typically contains from 7 mole % to 50 mole % maleic anhydride (maleic acid) monomer and conversely from 50 mole % to 93 mole % vinyl aromatic monomer, preferably styrene monomer. More usually, the starting polymer contains from 20 mole % to 40 mole % maleic anhydride (maleic acid) monomer and conversely from 60 mole % to 80 mole % vinyl aromatic monomer, preferably styrene monomer. The molecular weight of the copolymer (e.g., the SMA copolymer) may vary within wide limits. Preferably, the copolymer has a number-average molecular weight of between about 1000 and 300,000.

The copolymer (e.g., the SMA copolymer) can contain a minor amount (less than 50 mole % and usually less than 30 mole % based on the amount of maleic anhydride (maleic acid)) of another unsaturated carboxylic acid monomer such as aconitic acid, itaconic acid, acrylic acid, methacrylic acid, crotonic acid, isocrotonic acid, citraconic acid, and fumaric acid and the mixtures thereof.

The copolymer also can contain a minor amount (less that 50 mole % and usually less than 30 mole %, based on the amount of the vinyl aromatic monomer such as styrene) of another hydrophobic vinyl monomer. Another "hydrophobic vinyl monomer" is a monomer that typically produces, as a homopolymer, a polymer that is water-insoluble or capable of absorbing less than 10% by weight water. Suitable hydrophobic vinyl monomers within the broadest aspects of the present invention are exemplified by (i) vinyl esters of aliphatic acids such as vinyl acetate, vinyl propionate, vinyl butyrate, vinyl caproate, vinyl 2-ethylhexanoate, vinyl laurate, and vinyl stearate; (ii) diene monomers such as butadiene and isoprene; (iii) vinyl monomers and halogenated vinyl monomers such as ethylene, propylene, cyclohexene, vinyl chloride and vinylidene chloride; (iv) acrylates and alkyl acrylates, such as methyl acrylate, ethyl acrylate, n-propyl acrylate, isopropyl acrylate, n-butyl acrylate, isobutyl acrylate, tert-butyl acrylate, n-hexyl acrylate, cyclohexyl acrylate, and 2-ethylhexyl acrylate; and (v) nitrile monomers such as acrylonitrile and methacrylonitrile and mixtures thereof.

A preferred SMA copolymer for use in the binder composition of the present invention is one which is only soluble in water at a substantially alkaline pH and especially preferred are those SMA copolymers which are only soluble at an alkaline pH (as those terms are defined above). Such copolymers can be prepared by the bulk, free radical polymerization of maleic anhydride (alternatively maleic acid) and styrene, optionally in the presence of the other unsaturated monomers described above, using well-known technology. Indeed, such SMA copolymers are commercially available from many sources. Due to the hydrophobic property of such SMA copolymers, they yield cured non-woven fiber products, such as glass fiber products, with superior wet tensile strength properties.

Commercial sources of suitable SMA copolymers for use in preparing the aqueous binder composition of the present inventions include Sartomer (with products such as SMA-1000, SMA-2000 and SMA-3000) and NOVA Chemicals (with the DYLARK line of specialty grade SMA products).

In accordance with the present invention, to prepare the binder composition the copolymer (preferably an SMA copolymer) is initially modified by reaction with a primary alkanolamine (preferably monoethanolamine (MEA)). A primary alkanolamine is defined as compound that has both amino and hydroxyl functional groups as illustrated by 2-(2-aminoethoxy)ethanol, aminoethyl ethanolamine, aminobutanol and other aminoalkanols, and by monoethanolamine. This modification produces a soluble, modified copolymer having both hydroxyl and carboxyl groups. FIG. 1 illustrates the nature of the chemical reaction that is believed to take place as a consequence of the modification of the copolymer (an SMA copolymer is shown) with MEA.

The modification can be accomplished by mixing the copolymer (e.g., an SMA copolymer), which usually is supplied in flake or powder form, with a primary alkanolamine, preferably MEA. The alkanolamine-modified (e.g., MEA-modified) copolymer can then be diluted with water. Usually, the modification is accomplished by mixing the copolymer with an aqueous solution of the primary alkanolamine, such as MEA. Alternatively, initial mixing of the copolymer and primary alkanolamine (preferably MEA) can be in the absence of water (neat) with subsequent addition of water and optionally additional alkanolamine (MEA) as described in Examples 1 and 4 hereinafter.

The primary alkanolamine, such as MEA, generally is provided in an amount relative to the copolymer, sufficient to provide at least 0.05 mole of primary amine moiety per mole of MA monomer units in the copolymer. One should use less than about 2 moles of primary amine moieties, such as MEA, for each mole of MA monomer unit in the copolymer, and generally should not use more than about 1 mole of primary amine moieties, such as MEA, for each mole of MA monomer, as the excess primary amine would be available for reaction with free carboxyl groups and would not contribute to crosslink formation. Usually, the primary alkanolamine, such as MEA, is provided in an amount relative to the copolymer, sufficient to provide between about 0.05 mole to 0.4 mole of primary amine moiety per mole of MA monomer units in the copolymer.

An aqueous solution of from 0.1 to 99.9% (i.e., essentially neat primary alkanolamine such as MEA) by weight primary alkanolamine will generally be suitable for preparing the modified copolymer. While an aqueous-based reaction between the copolymer and the primary alkanolamine, such as MEA, can occur at an ambient temperature, usually to minimize the duration of this procedure it is preferred to conduct the reaction at a temperature in the range of 40 to 125° C. or higher. In order to minimize the amount of water that accompanies the binder composition during shipment and storage, it is preferable to use a concentrated solution of a primary alkanolamine, especially MEA, for modifying the copolymer. In any event, the solution of the primary alkanolamine used for preparing the modified copolymer will usually contain between 10 and 99.9 weight % of the primary alkanolamine, such as MEA.

As shown in FIG. 1, initially on mixing the copolymer (shown as an SMA copolymer) with MEA, as the primary alkanolamine, a reaction between the MA monomer units of the copolymer and the primary amine group of the MEA results is the formation of a hydroxyl terminated amide group and a free carboxyl group. Some of these adjacent groups may also react to form a hydroxyl-terminated imide group. Formation of the imide is favored under normal heating conditions in the range of 70 to 200° C. Imide formation may be advantageous as it provides the copolymer with additional hydrophobicity that may further augment the wet tensile strength properties of fiber products cured with the binder composition.

Through judicious selection of the starting copolymer, the quantity of the primary alkanolamine, such as MEA, and copolymer solubilization conditions, a modified copolymer is produced that can be self-curing.

It is preferred that the binder composition have at least a substantially alkaline pH (pH of at least 5.0) and it is more preferred that the pH of the binder composition actually be alkaline (pH of at least 7.0). As a result, in those instances where the pH of the modified copolymer is not sufficiently alkaline, the pH can be further increased by the addition of a base. One preferred base for this purpose is ammonia, other bases including secondary alkanolamine amines such as DEA and tertiary alkanolamine such as TEA also can be used for this purpose. Indeed, the addition of a secondary alkanolamine, a tertiary alkanolamine and mixtures thereof, especially, DEA and/or TEA, to the modified copolymer solution also serves as a polyol source for participating in crosslinking reactions that causes the binder composition to cure. It is preferred not to use inorganic bases, such as hydroxides, as these materials tend to reduce the hydrophobic character of the binder composition. Usually, ammonia in an amount of 1.0 to 10% by weight of the aqueous solution of the modified copolymer should be sufficient for this purpose.

As noted above, it will be desirable in most instances, and in fact preferred in many cases, to include some amount of a polyol in the binder composition. Such polyols include ethylene glycol, diethylene glycol, triethylene glycol, polyethyleneoxide (hydroxy terminated), glycerol, pentaerythritol, trimethylol propane, diethanolamine, triethanolamine, ethyl diethanolamine, methyl diethanolamine, sorbitol, a polysaccharide such as fructose, sucrose, and glucose, polyvinyl alcohols, resorcinol, catechol, pyrogallol, glycollated ureas, and 1,4-cyclohexane diol to name a few. Usually the addition of a secondary or tertiary alkanolamine, and especially DEA or TEA is preferred as these polyols also add alkalinity to the binder composition.

In the broad practice of the present invention, the amount of polyol in the composition, whether or not supplied in whole or in part by another alkanolamine such as DEA and/or TEA, should provide a mole ratio of —COOH contributed by the modified copolymer component (and any other optional polyacid in the composition) to —OH contributed both by the modified copolymer component and by any additional polyol component (i.e., the —COOH:—OH ratio of the composition) in the range of about 10:1 to 1:10, most often in the range of 5:1 to 1:5 and most usually in the range of 2:1 to 1:2. This mole ratio is conveniently determined by a calculating the ratio of the number of moles of the modified copolymer multiplied by its average —COOH functionality (plus any other polyacid component) to the sum of the number of moles of the modified copolymer multiplied by its average —OH functionality and the number of moles of the polyol component(s) multiplied by its (their) average functionality. Such calculation is readily performed by skilled workers given the overall teachings of the present invention. Preferably, the mole ratio of —COOH to —OH in the composition is in the range of about 2:1 to about 1:2 and more preferably in the range of 1.5:1 to 1:1.5.

The composition also could include as an additional polyacid component an aqueous substantially alkaline solution of a hydrolyzed (solubilized) copolymer of maleic anhydride and a vinyl aromatic compound such as styrene. The preparation of such a hydrolyzed (solubilized) copolymer is described in an application co-filed on even date herewith by the same inventors as listed on this application and bearing the same title and assigned the assignee's docket number GP 20078-USA, the disclosure of which co-filed application is incorporated herein in its entirety by this reference.

It may be preferred in many cases to use DEA and/or TEA as the principal polyol additive and in those instances where DEA and/or TEA is the principal polyol, it may nonetheless be desirable in some cases to include some amount (generally a small amount of less than 5 weight percent and often less than 1 weight percent) of an additional (optional) polyol as noted above. Other available additives for augmenting the cross-linking of the binder composition include urea and polyamino compounds, both synthetic and natural (e.g., protein sources such as soy). The present invention should not be limited to any selection of other optional crosslinking additives.

As noted above, in the making of non-woven fiber products, such as fiberglass insulation, the binder composition of the present invention usually is formulated into a dilute aqueous solution and then is usually applied, such as by spraying, onto fibers, such as glass fibers which in the case of fiberglass manufacture are generally hot from having been freshly formed. Binder compositions containing somewhere between 1% by weight and 50% by weight solids are typically used for making fiber products, including glass fiber products.

The aqueous solution of the modified copolymer can be easily blended with other ingredients commonly used in the binder compositions for preparing fiber products and diluted with additional water to a low concentration which is readily applied onto the fibers, such as by spraying.

For example, to prepare a binder composition for making fiberglass insulation, it may be advantageous to add a silane coupling agent (e.g., an organo silicon oil) to the adduct solution in an amount of at least about 0.05 wt. % based on the weight of binder solids. Suitable silane coupling agents (organo silicon oils and fluids) have been marketed by the Dow-Corning Corporation, Petrarch Systems, and by the General Electric Company. Their formulation and manufacture are well known such that detailed description thereof need not be given. This invention is not directed to and thus is not limited to the use of any particular silane additives.

Fibrous mat manufacturers also normally add "dedusting" oil to minimize dust formation in the finished product. Such dedusting oils are usually high boiling point mineral oils. Owens-Corning also adds dye to the binder formulation to color the product pink. Other pigments, such as carbon black, also may be added. This invention is not directed to and thus is not limited to the use of any such additives or pigments.

The binder composition may be prepared by combining the aqueous solution of the copolymer and the silane coupling agent in a relatively easy mixing procedure carried out at ambient temperatures. The binder composition can be used immediately and may be diluted with water to a concentration suitable for the desired method of application, such as by spraying onto the glass fibers.

Figure 2:
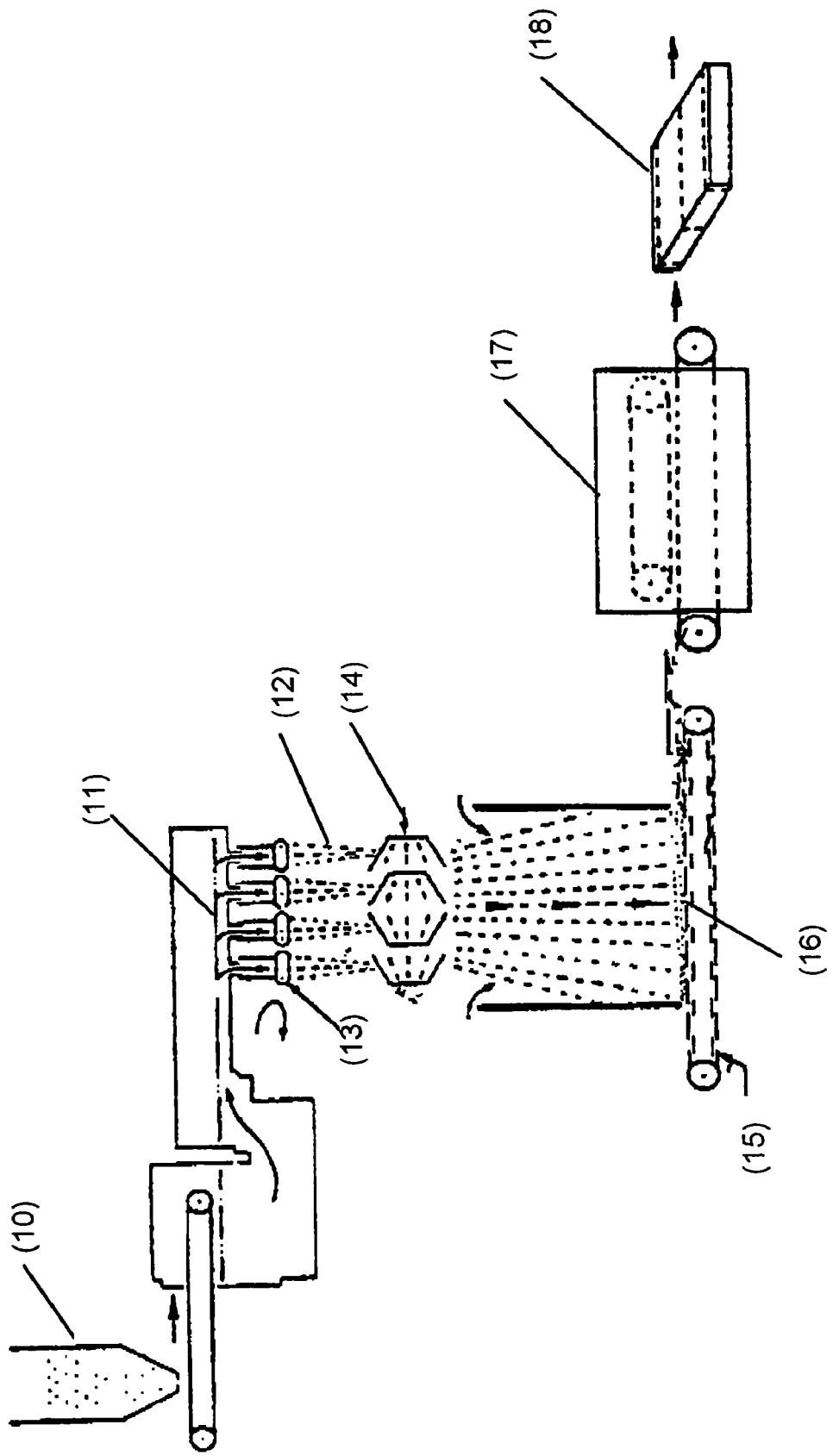
FIG. 2 schematically illustrates a method of making fiberglass insulation using the binder composition of the present invention.

FIG. 2 schematically illustrates the manufacture of fiberglass insulation in a continuous process wherein molten glass flows from a melting furnace (10) is divided into streams (11) and is attenuated into fibers (12). The fiber attenuation generally is performed by centrifuging the molten glass though spinners (13) or by fluid jets (not shown) to form discontinuous glass fibers (12) of relatively small dimensions and large aspect ratio. The predominant proportion of glass fibers used in the manufacture of fiberglass insulation has a diameter within the range from 0.5 to 20 μm and a length within the range from 0.5 to 10 cm.

A curable binder composition is generally formulated as a liquid and is applied usually by spraying (14) onto the hot glass fibers emerging from the fiber attenuation mechanism. The binder-treated fibers then are collected as they are randomly deposited on a moving foraminous conveyor belt (15). The dynamics of the binder application is such that much of the water in the binder is evaporated as the hot fibers are cooled by contact with the aqueous binder. The resin binder then becomes tacky holding the mass of fibers together as the resin begins to set. The fibers are collected on a conveyor belt (15) in a haphazard manner to form a non-woven mat (16). The depth (thickness) of the fibers forming the mat is determined by the speed of fiber formation and the speed of the conveyor belt (15). The fibrous product can be formed as a relatively thin product of about ⅛ to ¼ inch or it can be formed as a thick mat of 6 to 8 inches or even more. Depending on formation conditions, the density of the product also can be varied from a relatively fluffy low density product to a higher density of 6 to 10 pounds per cubic foot or higher, as is well understood by those skilled in the art.

The aqueous binder composition, after it is applied to the glass fibers, is heated to effect final drying and full curing. The duration and temperature of heating will affect the rate of processability and handleability, degree of curing and property development of the treated substrate. The curing temperatures are within the range from 50 to 300° C., preferably within the range from 90 to 230° C. and the curing time will usually be somewhere between 3 seconds to about 15 minutes.

On heating, water present in the binder composition evaporates, and the composition undergoes curing. These processes can take place in succession or simultaneously. Curing in the present context is to be understood as meaning the chemical alteration of the composition, for example crosslinking through formation to covalent bonds between the various constituents of the composition, especially the esterification reaction between pendant carboxyl (—COOH) of modified copolymer and the hydroxyl (—OH) moieties both of the modified copolymer and any added polyol, such as DEA and/or TEA, the formation of ionic interactions and clusters, and formation of hydrogen bonds.

As noted, the drying and curing functions may be conducted in two or more distinct steps, if desired. For example, the composition may be first heated at a temperature and for a time sufficient to substantially dry but not to substantially cure the binder composition and then heated for a second time at a higher temperature and/or for a longer period of time to effect curing (cross-linking to a thermoset structure). Such a preliminary procedure, referred to as "B-staging", may be used to provide a binder-treated product, for example, in roll form, which may at a later stage be fully cured, with or without forming or molding into a particular configuration, concurrent with the curing process. This makes it possible, for example, to use the compositions of this invention for producing binder-impregnated semi-fabricates which can be molded and cured elsewhere.

The aqueous binder of the present invention can be satisfactorily cured without the assistance of any condensation accelerator, i.e., in the absence of any condensation accelerator, at conventional temperatures and in a commercially acceptable period of time for making fiber products and particularly glass fiber products.

Suitable condensation accelerators that optionally can be used in the binder composition for promoting the esterification reaction, i.e., the crosslinking reaction, between the carboxylic (—COOH) moieties of the modified copolymer and the hydroxyl (—OH) moieties of both the modified copolymer and any added polyol, such as added DEA and/or TEA, include inorganic acids, such as sulfuric acid, lead acetate, sodium acetate, calcium acetate, zinc acetate, organotin compounds, titanium esters, antimony trioxide, germanium salts, ammonium chloride, sodium hypophosphite, sodium phosphite and organic acids such as methane sulfonic acid and para toluene sulfonic acid. The phosphorus accelerators (catalysts) described in U.S. Pat. No. 5,661,213 can also be optionally employed, but are not necessary to obtain a complete cure at a commercially acceptable temperature and within a commercially acceptable time. Other condensation accelerators that could be used will be apparent to those skilled in the art and the present invention is not limited to any particular optional condensation accelerator. Indeed, the use of the binder composition of the present invention is usually employed in the absence of such accelerators.

When used, the condensation accelerator would generally be present in an amount of 10 wt. % or less, more usually 0.01 to 10 wt. %, even more typically 0.1 wt. % to 5 wt. %, and most often 0.5 wt. % to 2 wt. %, based on the weight of the modified copolymer. However, as noted above, one of the advantages of the binder composition of the present invention is that such condensation accelerators are not necessary for obtaining cure of the binder composition of the present invention under commercially acceptable conditions of temperature and time, usually from about 140 to 240° C. and under 15 minutes.

In making fiberglass insulation, the binder composition is usually applied to the hot glass fibers as they are being produced and formed into a mat or blanket. In operation, water is volatilized from the binder as it is applied onto the hot glass fibers, and the high-solids binder-coated fibers are formed into a mat and heated to cure the binder fully and thereby produce a finished fiber product, e.g., fiberglass insulation product. The binder composition is generally applied in an amount such that the cured binder constitutes about 5 wt. % to about 15 wt. % of the finished glass fiber product, e.g., fiberglass insulation product, although it can be as little as 1 wt. % or less and as high as 20 wt. % or more, depending upon the type of glass fiber product. Optimally, the amount of binder for most thermal insulation products will be the amount necessary to lock the fibers into an integral mass by bonding the fibers where they cross or overlap. For this reason, it is desired to have binder compositions with good flow characteristics, so that the binder solution can be applied to the fiber at a low volume that will flow to the fiber intersections.

As recognized by those skilled in the art and depending to some extent on the nature of the non-woven fiber product being produced, the binder composition may be applied to the fibers by one of a variety conventional techniques such as, for example, air or airless spraying, padding, saturating, roll coating, curtain coating, beater deposition, and coagulation. For example, when making thin mats of glass fibers, such as those used in making roofing shingles, the binder composition can be applied to the glass fibers by flooding a collected mat of glass fibers and draining off the excess, by applying the binder composition onto the fibers during mat formation, by spraying the fiber mat or the like. In using the binder composition in connection with a paper fiber product, passing the non-woven web through a saturating bath of the binder composition may be a useful method for applying the binder, as well as roll transfer application.

The particular method for forming fibers, including heat resistant fibers and especially glass fibers, for use in the present invention is not unimportant. Continuous fibers also may be employed in the form of mats or blankets fabricated by swirling the endless filaments or strands of continuous fibers, or they may be chopped or cut to shorter lengths for mat or batt formation. Use can also be made of ultra-fine fibers formed by the attenuation of glass rods. Also, such fibers may be treated with a size, anchoring agent or other modifying agent before use or application of the binder.

Glass fiber insulation products may also contain fibers that are not in themselves heat-resistant such as, for example, certain polyester fibers, rayon fibers, nylon fibers, and super-absorbent fibers, in so far as they do not materially adversely affect the performance of the glass fiber product.

The fiber component will represent the principal material of the non-woven fiber products, such as a fiberglass insulation product. Usually 99-60 percent by weight of the product will be composed of the fibers, while the amount of binder solids will broadly be in reverse proportion ranging from 1-40 percent, depending upon the density and character of the product. Glass insulations having a density less than one pound per cubic foot may be formed with binders present in the lower range of concentrations while molded or compressed products having a density as high as 30-40 pounds per cubic foot can be fabricated of systems embodying the binder composition in the higher proportion of the described range.

Non-woven products and especially glass fiber products can be formed as a relatively thin product, such as a mat having a thickness of about 10 to 50 mils; or they can be formed as a relatively thick product, such as a blanket of 12 to 14 inches or more. Fiber products, including glass fiber products, of any thickness are embraced by the present invention. The time and temperature for cure for any particular glass fiber product will depend in part on the amount of binder in the final structure and the thickness and density of the structure that is formed and can be determined by one skilled in the art using only routine testing. For a structure having a thickness ranging from 10 mils to 1.5 inch, a cure time ranging from several seconds to 1-5 minutes usually will be sufficient at a cure temperature within the range of 175°-300° C.

Glass fiber products may be used for applications such as, for example, insulation batts or rolls, as reinforcing mat for roofing or flooring applications, as roving, as microglass-based substrate for printed circuit boards or battery separators, as filter stock, as tape stock, and as reinforcement scrim in cementitious and non-cementitious coatings for masonry. Still other uses will be readily apparent to those skilled in the art.

It will be understood that while the invention has been described in conjunction with specific embodiments thereof, the foregoing description and following examples are intended to illustrate, but not limit the scope of the invention. Other aspects, advantages and modifications will be apparent to those skilled in the art to which the invention pertains, and these aspects and modifications are within the scope of the invention.

EXAMPLE 1

To a standard resin kettle was added MEA (monoethanolamine—12 g) and DEA (diethanolamine—50 g) and SMA-1000 (from Sartomer) in an amount of 50 g. An exothermic reaction occurred in the mixture (an IR taken of the sample at this point, after about 30 minutes of reaction, showed the presence of a secondary amide). Another 150 g of the SMA-1000 then was added to the reaction mixture, followed by 730 g of water. The reaction mixture was heated to 90° C. for about 2 hours and a clear solution was obtained. The pH of the aqueous resin was 4.5. The pH of the resin was then raised to above 5.5 by the addition of aqueous (28% by weight) ammonia. The resulting resin product, when heated to about 200° C. in an oven showed good cure characteristics. An IR spectrum taken of the cured resin product showed the presence of ester, amid and imide groups.

EXAMPLE 2

To a standard resin kettle was added 600 g of SMA-1000, 1000 g of water, and 40 g of MEA (monoethanolamine). An exothermic reaction occurred in the mixture. An IR of the sample at this point, after about 30 minutes of reaction time, showed the presence of a secondary amide. At this point, 200 g of TEA then was added. The reaction mixture was heated to 90° C. for about 2 hours after which an additional 600 g of water was added and a clear solution was obtained. The pH of the aqueous resin was at 4.7. The pH of the resin was then raised to above 7.0 by the addition of aqueous ammonia. The IR spectrum of this aqueous resin solution following the neutralization showed the presence of amide and a minor amount of imide and carboxylate salt. The resin product was heated to about 200° C. in an oven and showed good thermosetting characteristics. The IR spectrum of the cured thermoset resin showed the presence of ester, amid and imide groups.

EXAMPLE 3

To a pressure reactor (Parr) were added 1500 g of water, 150 g of a high molecular weight SMA (Styrene:MA mole ratio of approximately 3:1), 15 .g of monoethanolamine (MEA), 20 g of aqueous ammonia (28%), and 40 g of additional water. The reactor was then sealed and heated to about 105° C. at which time the internal pressure had risen to about 10 psi. The contents of the reactor were held at this condition under constant stirring until all of the SMA had dissolved and the solution had reached a constant solids content (approximately 9.8%). An IR spectrum of the product at this point showed the presence of amide and carboxylate functionality. The product cured to a clear thermoset upon heating to 210° C. for 10 minutes.

EXAMPLE 4

To a standard resin kettle were added MEA (monoethanolamine —60 g) and DEA (Diethanolamine —200 g) (mixed with 25 g of water). SMA-1000 in an amount of 150 g also was added to the kettle. An exothermic reaction occurred in the mixture. After 30 minutes or reaction, 1661 g of water and 700 g of SMA-1000 were added to the reaction mixture. The reaction mixture was heated to 90° C. for about 4 hours, at which point a clear solution was obtained. The pH of the aqueous resin was 4.5. The pH of the aqueous resin was then raised to above 7.5 by addition of aqueous ammonia (160 g) and was diluted with an additional 350 g of water. The resin solids concentration was 34.71% by weight. The resin product when heated to about 200° C. in an oven showed good thermosetting characteristics.

EXAMPLE 5 (COMPARISON)

To a standard resin kettle was added 85 g of SMA-1000, 590 g of water and 26 g of triethanolamine (TEA). The mixture was heated to about 98° C. for about 4-6 hours, by which time all of the SMA had dissolved to produce a milky white solution. The pH of the solution was increased to 6.2 by the addition of 12 g of TEA and the solution became clear. The IR spectra of the resin solutions showed the presence of a large concentration of carboxylate functionality, and only a trace amount of ester functionality. The cured resin product showed the presence of ester and no amide, since TEA cannot form an amide with the SMA. This result indicates that the reaction of SMA with TEA under aqueous conditions is primarily a hydrolysis reaction where the anhydride is opened up by the TEA (acting as a base) and held as an ammonium carboxylate salt.

EXAMPLE 6 (COMPARISON)

To a standard resin kettle were added 200 g of SMA-1000, 62 g of DEA, and 786 g of water. The mixture was heated to about 98° C. for about 4-6 hours by which time all of the SMA had dissolved and the solution became clear. The reaction mixture was divided into two parts. The pH of each part was then adjusted with aqueous ammonia, one part to a pH of 5.5 and another part to a pH of 7.8. Both of these samples showed excellent cure characteristics when heated in an aluminum pan at 210° C. for 15 minutes. The IR spectra of the resin solutions showed the presence of a large concentration of carboxylate functionality, and only a trace amount of ester functionality. This IR spectrum indicates that the reaction of SMA with DEA under aqueous conditions is primarily a hydrolysis reaction where the anhydride is opened up by the DEA (acting as a base) and held as an ammonium carboxylate salt. The IR spectra of the cured sample showed the presence of both ester and amide indicating the crosslinking occurs by both ester and amide formation.

EXAMPLE 7

To the binder preparations described in Example 1 and Example 6 (Comparison) was added an aqueous 40% (by weight) urea solution in an amount to provide about 10% by active weight of urea and the resulting binder solutions were adjusted to 20% by weight total solids with additional water. The resulting binder solutions showed excellent thermosetting properties when heated 210° C.

EXAMPLE 8

Tensile strengths (dry, wet and hot/wet) of hand sheets prepared using aqueous binder compositions of the type prepared in accordance with the present invention were examined. Hand sheets were prepared by sprinkling the binder onto a glass mat, formed from ±2 inch PPG M-8035 chopped glass fibers dispersed in water containing a polyacrylamide, vacuuming the excess binder off the glass fibers and then curing the sheet in an oven at 200 to 240° C. for 1 to 5 minutes.

Dry tensile, wet tensile and hot/wet tensile strengths of mats prepared using these binder compositions were measured on a Thwing-Albert tensile tester (0-200 kg load cell).

Dry tensile strengths of mats prepared using the binder compositions were measured by subjecting 3 inch by 5 inch samples of the hand sheets, prepared in the manner outlined below, to breaking using the QC-1000 Materials Tester by the Thwing Albert Instrument Co.

Wet tensile strengths of mats prepared using the binder compositions were measured by soaking, for 10 minutes, 3 inch by 5 inch samples of the handsheets, prepared as outlined below, in water maintained at 25° C. The samples of the hand sheets were then subjected to breaking using the same tensile tester while they were still wet.

Hot/wet tensile strength of mats prepared using these binder compositions were then measured by soaking the handsheets in 185° F. (85° C.) water for 10 minutes. Samples of the hand sheets (3 inches by 5 inches) were then subjected to breaking in the same tensile tester (QC-1000 Materials Tester by the Thwing Albert Instrument Co.) while they were still hot and wet.

Table 1 below reports tensile test results performed on hand sheets made with a standard phenol-formaldehyde (PF) resin (GP 2894) that is commercially available from Georgia-Pacific Resins, Inc. and conventionally used to make fiberglass insulation. The results using the conventional PF resin can be compared to the results obtained using the comparative binders (Example 5, Example 6 and Example 7(6)), and binder compositions of the invention (Example 1, Example 3 and Example 7(1)) as shown below in Table 1. Generally, the binders are applied at a solids content of 20% by weight, However, the binder of Example 3 was prepared at about 10% by weight total solids and thus was used directly without modification.

The tensile strength results (reported as pounds per linear inch) of the various samples are reported in Table 1. Average results are reported and were obtained by averaging at least 8 replicates

TABLE 1

| | Standard PF Resin Binder | Ex. 1 Binder | Ex. 3 Binder | Ex. 7(1) Binder | Ex. 5 Binder | Ex. 6 Binder | Ex 7(5) Binder |
|---|---|---|---|---|---|---|---|
| Dry Tensile Strength | 85.2 | 112.8 | 48.3 | 115.8 | 68.4 | 78.3 | 74.6 |
| Wet Tensile Strength | 60.5 | 105.6 | — | 108.1 | 60.8 | 72.6 | 71.6 |
| Hot/Wet Tensile Strength | 47.5 | 102.4 | 43.8 | 93.9 | 48.9 | 70.3 | 61.9 |

The results presented above demonstrate that examples of the invention exhibit excellent results relative to a commercial PF resin binder and to the comparison examples.

The present invention has been described with reference to specific embodiments. However, this application is intended to cover those changes and substitutions that may be made by those skilled in the art without departing from the spirit and the scope of the invention. Unless otherwise specifically indicated, all percentages are by weight. Throughout the specification and in the claims the term "about" is intended to encompass + or −5%.

We claim as follows:

1. A cured binder composition comprising
   (1) primary alkanolamine-modified copolymer of maleic anhydride and a vinyl aromatic compound, and
   (2) a polyol,
   wherein said binder composition is cured at a temperature between 175° and 300° C. and has crosslinks that form through esterification reactions between the primary alkanolamine-modified copolymer and the polyol.

2. The cured binder composition of claim 1 wherein the primary alkanolamine used to modify the copolymer is selected from the group consisting of 2-(2-aminoethoxy) ethanol, aminoethyl ethanolamine, aminobutanol, monoethanolamine and mixtures thereof.

3. The cured binder composition of claim 2 wherein the primary alkanolamine-modified copolymer is a monoethanolamine-modified copolymer.

4. The cured binder composition of claim 3 wherein said monoethanolamine-modified copolymer is prepared by reacting a copolymer of maleic anhydride and a vinyl aromatic compound with monoethanolamine.

5. The cured binder composition of claim 4 wherein the vinyl aromatic compound is styrene.

6. The cured binder composition of claim 5 wherein from 0.01 to 0.4 mole of monoethanolamine is reacted with the copolymer of maleic anhydride and styrene per mole of maleic anhydride monomer of said copolymer.

7. The cured binder composition of claim 6 wherein the copolymer of maleic anhydride and styrene contains from 7 mole % to 50 mole % maleic anhydride monomer and from 50 mole % to 93 mole % styrene monomer.

8. The cured binder composition of claim 7 wherein the copolymer of maleic anhydride and styrene contains an additional unsaturated carboxylic acid monomer in an amount of less than 30 mole % based on the amount of maleic anhydride.

9. The cured binder composition of claim 8 wherein the additional unsaturated carboxylic acid monomer is selected from the group consisting of aconitic acid, itaconic acid, acrylic acid, methacrylic acid, crotonic acid, isocrotonic acid, citraconic acid, fumaric acid, lower alkyl esters thereof and mixtures thereof.

10. The cured binder composition of claim 7 wherein the copolymer of maleic anhydride and styrene contains another hydrophobic vinyl monomer in an amount of less than 30 mole % based on the amount of vinyl aromatic monomer.

11. The cured binder composition of claim 10 wherein the hydrophobic vinyl monomer is selected from the group consisting vinyl acetate, vinyl propionate, vinyl butyrate, vinyl caproate, vinyl 2-ethylhexanoate, vinyl laurate, vinyl stearate, butadiene, isoprene, ethylene, propylene, cyclohexene, vinyl chloride, vinylidene chloride, methyl acrylate, ethyl acrylate, n-propyl acrylate, isopropyl acrylate, n-butyl acrylate, isobutyl acrylate, tert-butyl acrylate, n-hexyl acrylate, cyclohexyl acrylate, 2-ethylhexyl acrylate, acrylonitrile, methacrylonitrile and mixtures thereof.

12. The cured binder composition of claim 7 wherein the copolymer of maleic anhydride and styrene contains from 20 mole % to 40 mole % maleic anhydride monomer and from 60 mole % to 80 mole % styrene monomer.

13. The cured binder composition of claim 1 wherein the polyol is selected from the group consisting of ethylene glycol, diethylene glycol, triethylene glycol, hydroxy terminated polyethyleneoxide, glycerine, pentaerythritol, trimethylol propane, sorbitol, a polysaccharide, polyvinyl alcohol, resorcinol, catechol, pyrogallol, glycollated ureas, 1,4-cyclohexane diol, triethanolamine, diethanolamine, ethyl diethanolamine, methyl diethanolamine, and mixtures thereof.

14. The cured, binder composition of claim 13 wherein the polyol is selected from the group consisting of ethyl diethanolamine, methyl diethanolamine, diethanolamine, triethanolamine and mixtures thereof.

15. The cured, binder composition of claim 14 wherein the modified copolymer has been solubilized by the diethanolamine, triethanolamine, or a mixture thereof.

16. The cured binder composition of claim 3 further comprising a polyamino extender.

17. The cured binder composition of claim 16 wherein the polyamino extender is urea.

18. The cured binder composition of claim 7 wherein the polyol is selected from the group consisting of ethylene glycol, diethylene glycol, triethylene glycol, hydroxy terminated polyethyleneoxide, glycerine, pentaerythritol, trimethylol propane, sorbitol, a polysaccharide, polyvinyl alcohol, resorcinol, catechol, pyrogallol, glycollated ureas, 1,4-cyclohexane diol, triethanolamine, diethanolamine, ethyl diethanolamine, methyl diethanolamine, and mixtures thereof.

19. The cured binder composition of claim 18 wherein the polyol is selected from the group consisting of triethanolamine, diethanolamine, ethyl diethanolamine, methyl diethanolamine, and mixtures thereof.

20. The cured binder composition of claim 9 wherein the modified copolymer has been solubilized by the diethanolamine, triethanolamine, or mixture thereof.

21. The cured binder composition of claim 7 further comprising a polyamino extender.

22. The cured binder composition of claim 21 wherein the polyamino extender is urea.

23. The cured binder composition of claim 1 wherein the polyol is selected from diethanolamine, triethanolamine, or a mixture thereof.

24. The cured binder composition of claim 1 further containing heat resistant fibers.

25. The cured binder composition of claim 24 wherein the heat resistant fibers are glass fibers.

26. The cured binder composition of claim 1 wherein the binder composition is a substantially alkaline, formaldehyde free composition.

* * * * *